United States Patent [19]

Batinovich

[11] 4,320,865
[45] Mar. 23, 1982

[54] APPARATUS FOR ATTACHMENT OF DIE TO HEAT SINK

[75] Inventor: Victor A. Batinovich, Los Altos, Calif.

[73] Assignee: National Semiconductor Corporation, Santa Clara, Calif.

[21] Appl. No.: 132,791

[22] Filed: Mar. 21, 1980

[51] Int. Cl.³ .................... H01L 21/52; H05K 3/34; B23K 31/02
[52] U.S. Cl. .................................. 228/6 A; 228/220
[58] Field of Search ............... 228/4.1, 5.1, 6 A, 218, 228/219, 220

[56] References Cited

U.S. PATENT DOCUMENTS

| 3,617,682 | 11/1971 | Hall | 228/219 X |
| 3,731,867 | 5/1973 | Frisbie et al. | 228/6 A |
| 3,920,949 | 11/1975 | Clawson et al. | 228/4.1 X |
| 3,964,664 | 6/1976 | Butler et al. | 228/6 A |

FOREIGN PATENT DOCUMENTS 52-2277  1/1977  Japan ................................. 228/220

Primary Examiner—Robert D. Baldwin
Attorney, Agent, or Firm—Brown & Martin

[57] ABSTRACT

A system for automatic and high production attachment of dies to heat sinks and other supporting structure includes an open ended gas tunnel having an inlet at one end, an outlet at the other end with means for indexing supporting structures step by step through the tunnel with heating means for heating the supporting structure in a first portion of the tunnel with automatic manipulating means for selecting and introducing first, a solder pre-form onto the heated support structure and then a die onto the melted solder with a source of forming gas continuously fed into the tunnel for controlling the atmosphere therein, and also for quickly quenching and cooling the solder after the die has been placed thereon. The method includes selecting a tunnel as above described, including a source of forming gas and selectively introducing support structures into one end of the tunnel indexing the structures through the tunnel while simultaneously heating them to the melting point of solder, introducing a solder pre-form onto the support structure and thereafter introducing a die onto the melted solder and cooling the solder while indexing the support structure and assembly through the tunnel.

11 Claims, 14 Drawing Figures

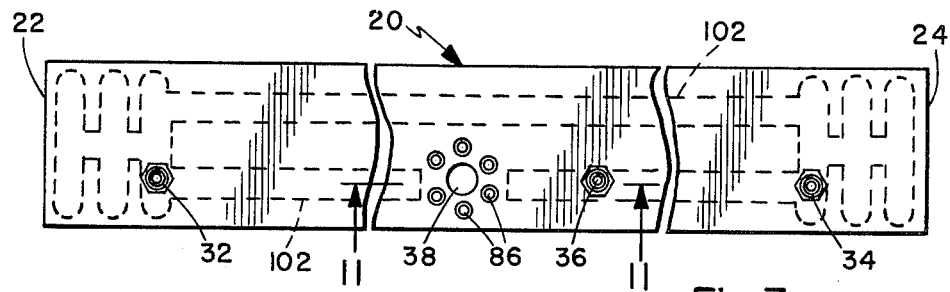
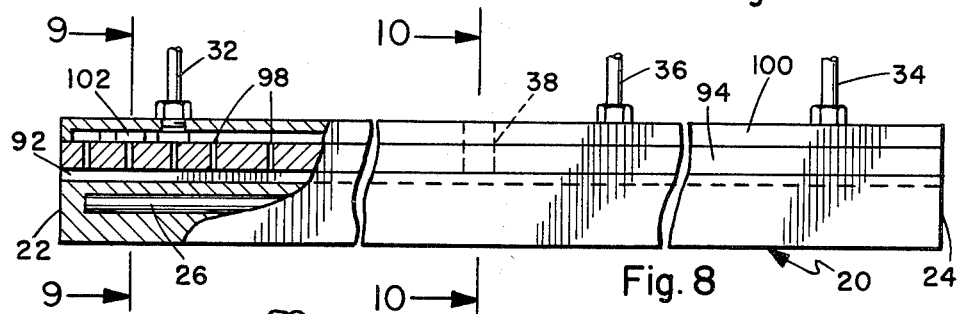
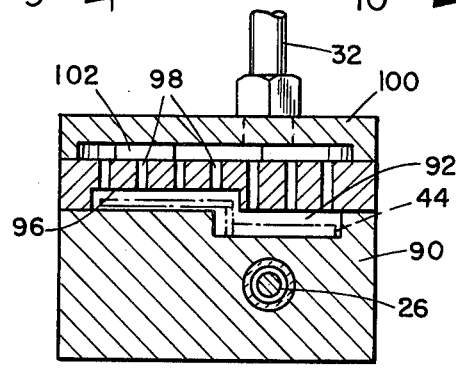
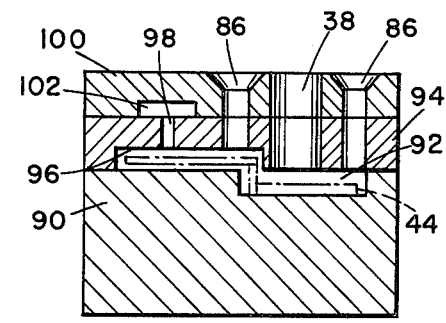
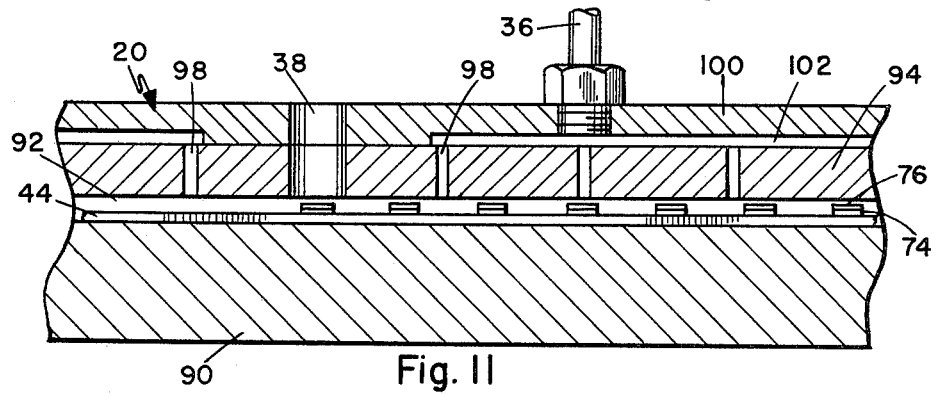

APPARATUS FOR ATTACHMENT OF DIE TO HEAT SINK

BACKGROUND OF THE INVENTION

The present invention relates to micro circuits and pertains particularly to the packaging and fabrication of and mounting of certain dies or chips.

Many electronic devices such as power transistors require a heat sink in order to dissipate or transfer heat from the system during operation. The chip or die is bonded to a heat sink for this purpose. The bonding of the transistor or die element of the transistor to a heat sink is critical in order to assure adequate heat transfer from the transistor or die.

In the production of power transistors, a die is mounted by soldering directly to a heat sink which may also form a portion of the lead frame for the package assembly. The soldering of the die to the heat sink as pointed out above is critical in order to assure a uniform transfer of heat from the die to the heat sink.

In the conventional technique of soldering such dies or chips to the heat sink, the heat sink is loaded on a conveyor to be passed through a furnace during which time the solder is melted and the die is bonded to the heat sink. This operation in the conventional or prior art approach involves the loading of heat sinks onto a conveyor and the hand loading of solder pre-forms on the respective heat sinks and thereafter the loading of a die or chip onto the pre-form with a weight loaded onto the chip. As illustrated in FIG. 1, for example, a heat sink or lead frame 10 is loaded onto a conveyor to pass through a furnace. A solder pre-form 12 is placed on the heat sink in the position where the die is to be bonded. Thereafter a die or chip 14 is then placed on top of the solder pre-form 12 and a weight 16 placed on top of the die. This is all done manually with the orientation and placement of the die 14 being critical. In the conventional approach this hand loaded assembly is then passed through a furnace which heats the assembly to a temperature that melts the solder 12, allowing the die 14 then to be pressed down by the weight 16 into contact with the lead frame or heat sink 10. Frequently this approach results in an inefficient bonding, such as illustrated in FIG. 2, where the die 14 rides up on top of the solder 12 at an angle, which is exaggerated for illustrative purposes. This results in a poor bonding of the die to the heat sink. Also gas bubbles may form between the die, and the solder or the lead frame, resulting in a poor heat transfer path.

The prior art approach resulted in higher cost production because of the low unit production by the hand assembly method and a high expense, not only because of the labor but also because of the excessive amount of forming gas required for the typical furnace. Furnaces for such assembly are typically on the order of approximately 30 feet in length and require 150 cubic feet per hour of nitrogen on each end of the furnace and a 150 cubic feet per hour of hydrogen inside of the furnace. The unit throughput per hour of such systems was on the order of approximately 350 units per hour.

In addition to the low production rate and high cost as a result of the high gas usage, the weights on top of the dies would frequently move causing a misorientation as well as uneven soldering of the die. This resulted in rejects of a fairly high percentage of the production due to the poor bonding as well as the possible misorientation of the die. Frequently a die assembly will emerge from the furnace with the die 14 misoriented as illustrated in FIG. 3. Wire bonding of the lead frame to the die becomes difficult under such circumstances and frequently cannot be accomplished with automatic bonding equipment.

The present invention was conceived and developed to overcome the above and other problems of the prior art.

SUMMARY AND OBJECTS OF THE INVENTION

It is the primary object of the present invention to provide an improved system for attaching semiconductor chips to supporting structure.

In accordance with a primary aspect of the present invention, a system for attaching dies to lead frames or other supporting structure includes an elongated open ended tunnel having inlet end and outlet end with means for indexing support structures therethrough, a source of forming gas for preventing outside air from entering tunnel, a source of the heat for heating the support structures, and handling mechanism for selecting and placing solder pre-forms and dies onto the support structure as it is indexed through the tunnel.

BRIEF DESCRIPTION OF THE DRAWINGS

The above and other objects and advantages of the invention will be apparent from the following description when read in conjunction with the drawings, wherein:

FIG. 7 is a top plan view of the tunnel unit.

FIG. 8 is a side elevation view of the tunnel unit, with a portion cut away.

FIG. 9 is an enlarged sectional view taken on line 9—9 of FIG. 8.

FIG. 10 is an enlarged sectional view taken on line 10—10 of FIG. 8.

FIG. 11 is an enlarged sectional view taken on line 11—11 of FIG. 8.

DETAILED DESCRIPTION OF A PREFERRED EMBODIMENT

Figure 1:
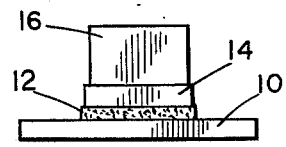
FIG. 1 is a side elevation view of the prior art method.
Figure 2:
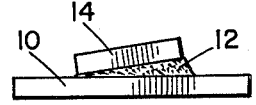
FIG. 2 is a view like FIG. 1 of the prior art result.
Figure 3:
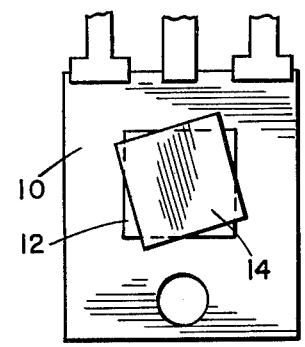
FIG. 3 is a top plan view of FIG. 2.

Turning to the drawings there is illustrated in FIGS. 1–3 certain aspects of the prior art approach as described in the Background of the Invention.

Figure 4:
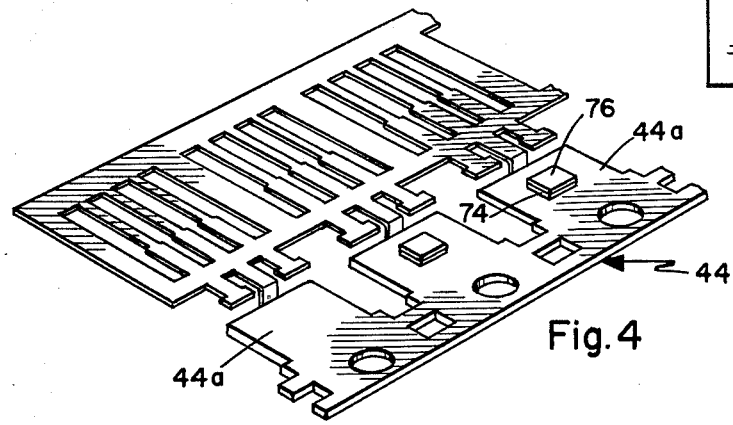
FIG. 4 is a perspective view of a typical heat sink strip.

A portion of a strip heat sink and lead frame assemblies is illustrated in FIG. 4. The heat sinks are typically made in strips 44, with each strip containing a plurality, such as 12, of individual heat sinks 44a which are later separated for individual packages. Lead frames as shown may also be attached to the sinks prior to the assembly and packaging state.

Figure 5:
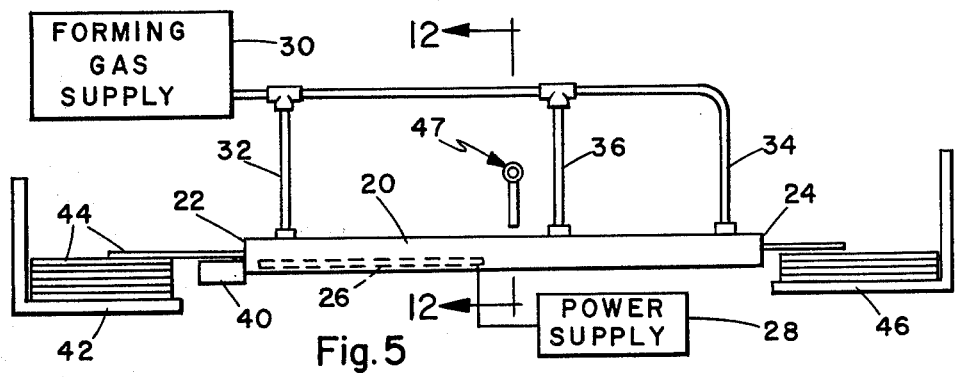
FIG. 5 is a side elevation view of a system in accordance with the present invention.
Figure 6:
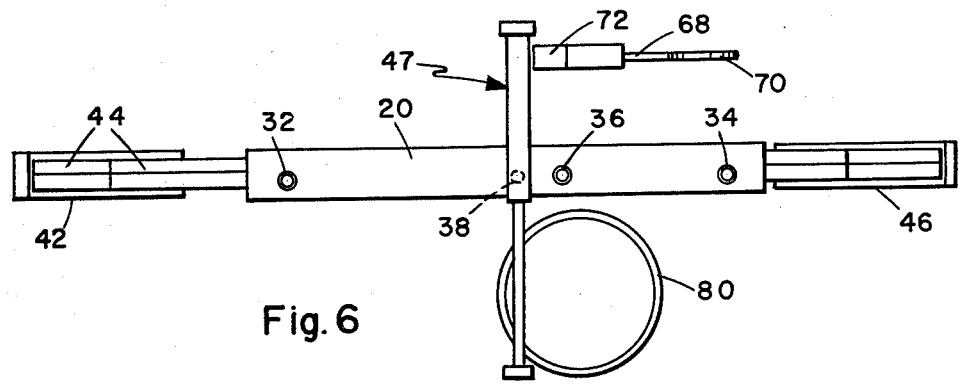
FIG. 6 is a top plan view of the system of FIG. 5.

Turning to FIGS. 5 and 6 of the drawing there is schematically illustrated a system in accordance with the invention. The system in accordance with the invention comprises generally, a tunnel 20 having an inlet end 22 and an outlet end 24. A source of the heat such as a heating element 26 introduces heat into the system along at least the first half of the tunnel. A source of electrical or other power 28 provides the source or power for the heat.

A forming gas source 30 supplies a flow of gas along a conduit 32, at the inlet end of the tunnel and by way of a conduit 34 at the outlet end of the tunnel. This supply of gas is effective and controlled to prevent the entrance of outside air into the tunnel during the forming process. A further supply of gas is supplied by conduit 36 to the tunnel just aft of an access opening 38 into which the elements to be mounted are assembled, and introduced. This source at 36 provides a quenching source of gas for the solder. An indexing device or mechanism 40 engages and indexes the lead strips of heat sinks through the tunnel. The indexing device is preferably of a positive engaging type such as a pin engaging a hole or slot in the heat sink strip and advances it a predetermined distance per step.

A supply magazine or elevator 42 at the left or entrance end of the tunnel 20 hold a plurality of strips of heat sinks 44 which are fed into the inlet end of the tunnel and indexed step by step therethrough. The heat sinks exit the tunnel at the outlet 24 and are deposited in an elevator or magazine 46. The assembled units are thus collected at this point. A handling mechanism 47 (FIG. 6) alternately picks up solder pre-forms from strip 68 at 72 and dies at 80 and places them on heat sinks in the tunnel.

The forming gas consists of nitrogen and hydrogen in a proportion of approximately 90% nitrogen and 10% hydrogen. This has been found to be the preferred ratio with the nitrogen preventing the entrance of outside air including oxygen and the like and the hydrogen acting as a flux for preventing oxidation within the chamber itself. This results in preventing the formation of an oxidizing scale on the solder pre-forms that are introduced into the system. This eliminates the necessity of scrubbing the solder pre-form prior to placement of the die on it.

The details of construction of the tunnel is illustrated in FIGS. 7 through 11. The tunnel includes a base member 90 having a slot or channel 92 for receiving the heat sink strips. A gas distributing manifold includes a first cap member 94 having a channel 96 and a plurality of gas ports 98 for feeding gas into the tunnel or passage formed by 92 and 96. The resulting tunnel has a cross-section similar to that of the part to pass therethrough. A second cap member 100 includes a network of interconnected channels 102 for distributing gas to the ports from the gas supply lines 32, 34 and 36. The gas ports are arranged at each end of the tunnel in a plurality of rows (three illustrated) of closely spaced ports (FIG. 9) across the entrance and exit to provide a gas curtin that prevents air and moisture from the surrounding atmosphere from passing into the tunnel. These rows of ports are fed by gas channels formed in cap member 100 as can be seen in FIG. 7. Gas ports directly above the passage for the heat sink and lead frames direct gas directly onto these members. Ports directly downstream (i.e., to the right in FIG. 11) of the access port 38 supply gas directly from supply line 36 for cooling the solder after the dies 76 have been placed on the solder.

Gas fed into the tunnel escapes from the ends of the tunnel and from the access port 38 and special ports 86 surrounding the access port 38. The special ports 86 are shaped and located around port 38 in a manner to reduce air turbulence in the vicinity of port 38. The elimination of the turbulence around port 38 permits the placement of the solder pre-form and chip through the port without disturbance.

Figure 12:
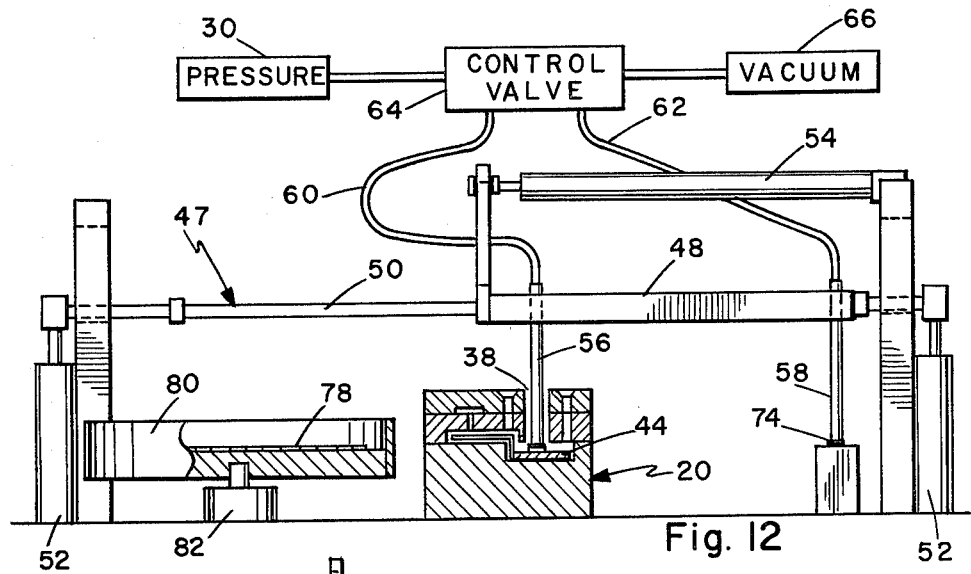
FIG. 12 is an enlarged sectional view taken on line 12—12 of FIG. 5, showing in more detail the chip and solder pre-form loading mechanism.
Figure 13:
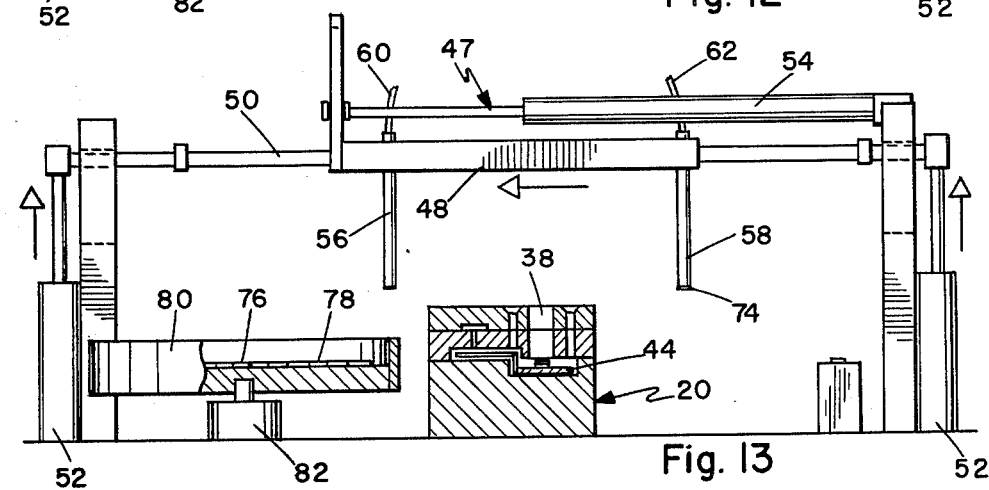
FIG. 13 is a view similar to FIG. 12, showing the mechanism in the transfer position.
Figure 14:
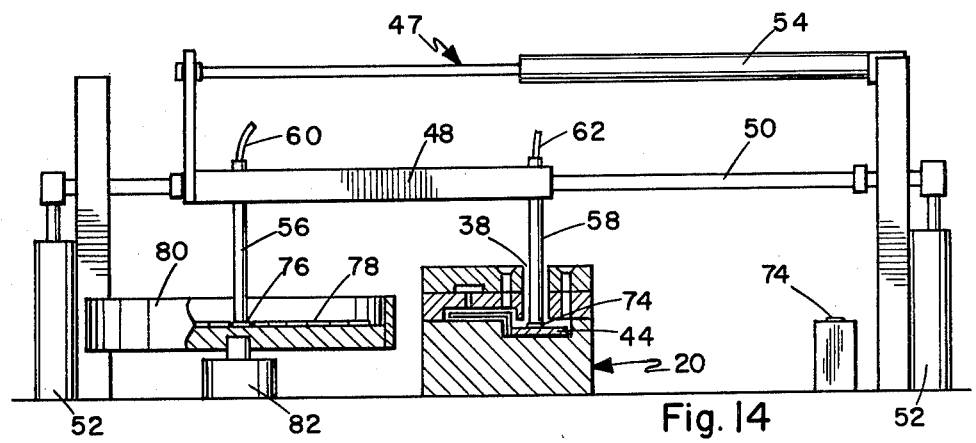
FIG. 14 is a further similar view showing the mechanism in the chip pick up and pre-form deposit position.

The system includes a handling mechanism designated generally at 47, as seen in FIG. 6 and 12 through 14, for the selection and introduction of solder pre-forms and dies into the tunnel through port 38 onto the heat sinks. This handling mechanism 47 includes an elongated carriage or beam 48 which is supported for movement along a support beam 50 which is supported and oscillated vertically such as by a pair of fluid jacks 52. The jacks 52 move the beam 50 vertically and a suitable mechanism such as a hydraulic or air jack 54 functions to move the support carriage 48 longitudinally along the beam 50. Thus the support carriage 48 as seen in FIGS. 12, 13, 14, is alternately raised, lowered, and oscillated back and forth to either side of the tunnel 20. At each end of the support carriage 48 is a vacuum chuck or collet 56 and 58 which are activated by means of pressurized forming gas supplied thereto and a vacuum supplied thereto alternately through flexible lines or conduits 60 and 62. The chucks 56 and 58 can be as illustrated simply open ended vacuum tubes that engage and grip the article (i.e., pre-form or die) when a vacuum is established therein. When the tube 56 or 58 is pressurized, it ejects or blows the article off the end thereof. These conduits or flex lines are connected by means of valving system 64 to the source 30 of the forming gas or alternately to a vacuum system or pump 66. Thus, the collets alternately pressurized are evacuated by alternately directing or connecting them to pressurized gas or vacuum. These collets function to pickup and transfer a solder pre-form and a die. The solder pre-form is preferably supplied such as by means of a ribbon shown at 68 in FIG. 6 from a spool 70 onto a cutting mechanism 72 which cuts small portions of the solder ribbon into pre-form pieces for being transferred into the tunnel. The solder pre-forms are dispensed such that the tip of the one collet 58 engages the pre-form upon being lowered to the lowermost position as shown in FIG. 6 to the right and as shown particularly in FIG. 12. The system is controlled such that upon engagement of the solder pre-form by means of the chuck or collet 58, the vacuum will be automatically coupled to the collet 58, thus picking up the pre-form. The transfer mechanism then picks up the solder pre-form, moves to the position as shown in FIG. 14, lowers the collet 58 through the access opening 38 in the tunnel and deposits the solder pre-form on top of the properly positioned heat sink 44 within the tunnel. At the same time that the transfer mechanism is in the position as shown in FIG. 14, it picks up a die 76 from a wafer 78 that has been diced and is held in an X–Y axis index table 80 on the opposite side of the tunnel from the solder pre-forms. At this point an ejection mechanism 82 punches a die 76 from the wafer 78 directly beneath the chuck or collet 56 which is then supplied automatically with vacuum for grasping the die. The transfer mechanism then, at the same time as it is picking up the die, deposits the solder pre-form 74 onto the lead frame 44 by means of positive gas pressure supplied thereto by means of the valving system 64 from the pressurized forming gas 30.

This sequence of transferring alternately a solder pre-form and a die onto the heat sink or lead frame continues as the lead frames are indexed step by step through the tunnel. Upon depositing the solder pre-form 74 onto the lead frame or heat sink 44, the solder instantly melts due to the heat within the tunnel and as the die is then deposited on the solder, a positive blast of air through the collet 56 deposits the properly oriented die 76 directly on the melted solder pre-form. The surface tension of the solder acts to hold the die in place until the heat sink is indexed to the next position which is directly beneath the quenching gas supply at 36, thus cooling the solder to a solid state holding the die in position. With this system very high speed automatic assembly of dies to heat sinks can be accomplished resulting in high productivity, a low number of rejects, and a considerable savings also in the consumption of gas. The present system can be constructed with a tunnel having a length of on the order of 30 to 32 inches as compared to a furnace assembly and in accordance with the prior art of a furnace on the order of 30 to 32 feet.

The steps of the present method also contribute to its advantages. These steps include the selection of an appropriate tunnel having means for introducing heat and a forming gas into the tunnel for controlling the atmosphere, means for introducing the lead frames or heat sinks into one end of the tunnel, and indexing them step by step through the tunnel to the exit. These steps include introducing heat to the lead frame or heat sink in the first half of the tunnel selecting and placing a solder pre-form onto the heat sink at the proximate middle of the tunnel, thereafter selecting and placing a die on the melted solder pre-form, indexing the assembly one step and at that point introducing or applying a quenching gas to the combined assembly and continuing the previous steps in sequence for each lead frame or heat sink introduced into the system. The method includes mixing and introducing a forming gas consisting of approximately 10% hydrogen and 90% nitrogen into the tunnel at appropriate locations to function to prevent the entrance of outside air into the tunnel.

Turning to FIG. 10, details of the construction of the access opening are illustrated which reduce turbulence in the opening area. This consists of a plurality of conical shaped openings 86 opening outward from the tunnel with the enlarged end of the opening outward. This results in reducing and controlling the turbulence around the access opening and prevents interference with the introduction of the pre-form and the die into the tunnel.

While I have illustrated and described my invention by means of specific embodiments, it is to be understood that numerous changes and modifications may be made therein without departing from the spirit and scope of the invention as defined in the appended claims.

Having described my invention, I now claim:

1. A system for attaching dies to heat sinks comprising in combination:

a housing defining an elongated tunnel having an inlet at one end and an outlet at the other;

indexing means for indexing support members from said inlet through said tunnel to said outlet;

an access opening in said housing communicating with said tunnel intermediate the ends thereof;

heating means for heating support members in said tunnel to a solder melting temperature;

gas distributing means in said housing for distributing a forming gas throughout said tunnel for preventing entrance of atmospheric air into said tunnel; and handling means coordinated with said indexing means for selecting and placing a solder pre-form and a die through said access opening onto a support member in said tunnel for bonding said die to said support member.

2. The system of claim 1, wherein said heating means is disposed between said inlet and said access opening.

3. The system of claim 2, including a source of quenching gas between said access opening and said outlet.

4. The system of claim 1, wherein said access opening is surrounded by turbulence reducing gas ports.

5. The system of claim 1, wherein said housing includes:

a base member defining a bottom portion of said tunnel, a first cap member defining a top port of said tunnel; and said gas distributing means includes a plurality of ports opening from said cap member into said tunnel.

6. The system of claim 5, including a plurality of rows of ports extending across the inlet and a plurality of rows or ports extending across the outlet.

7. The system of claim 6, including a second cap member mounted on said first cap member and including channel means for distributing gas to said ports.

8. The system of claim 5, wherein said tunnel has substantially the same cross sectional configuration as the support member to pass therethrough.

9. The system of claim 7, wherein said access opening extends through said first and second cap members to said tunnel.

10. The system of claim 3, wherein said handling means comprises an elongated carriage member mounted for independent vertical and horizontal oscillation; and first gripping means mounted on one end of said carriage member and second gripping means mounted on the other end of said carriage member; and means for selectively reciprocating said carriage member for extending alternate ones of said gripping means into said access opening for placing solder pre-forms and dies on support members passing through said tunnel.

11. The system of claim 10, wherein:

each of said first and second gripping means comprises a vacuum pickup tube, and means for selectively evacuating and pressurizing each of said tubes.

* * * * *